(12) United States Patent
Lee et al.

(10) Patent No.: US 8,014,190 B2
(45) Date of Patent: *Sep. 6, 2011

(54) RESISTANCE VARIABLE MEMORY DEVICE AND METHOD OF WRITING DATA

(75) Inventors: Jung Hyuk Lee, Hwaseong-si (KR);
Kwangjin Lee, Hwaseong-si (KR);
Daewon Ha, Seoul (KR); Gitae Jeong, Seoul (KR); Daehwan Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/023,759

(22) Filed: Feb. 9, 2011

(65) Prior Publication Data

US 2011/0134687 A1 Jun. 9, 2011

Related U.S. Application Data

(63) Continuation of application No. 12/471,526, filed on May 26, 2009, now Pat. No. 7,907,437.

(30) Foreign Application Priority Data

May 27, 2008 (KR) .................................. 2008-49221

(51) Int. Cl.
*G11C 11/00* (2006.01)

(52) U.S. Cl. ........................................ 365/148; 365/163
(58) Field of Classification Search .................. 365/148, 365/163
See application file for complete search history.

(56) References Cited

U.S. PATENT DOCUMENTS

| 7,518,934 B2 * | 4/2009 | Bedeschi et al. ......... 365/189.18 |
| 7,907,437 B2 * | 3/2011 | Lee et al. ....................... 365/148 |
| 2004/0228163 A1 | 11/2004 | Khouri et al. |
| 2005/0281073 A1 | 12/2005 | Cho et al. |
| 2006/0126380 A1 | 6/2006 | Osada et al. |
| 2007/0008770 A1 | 1/2007 | Nagao et al. |

FOREIGN PATENT DOCUMENTS

| JP | 2006-004614 | 1/2006 |
| JP | 2006-155700 | 6/2006 |
| JP | 2007-018615 | 1/2007 |
| KR | 1020050120485 A | 12/2005 |
| KR | 1020070006608 A | 1/2007 |

* cited by examiner

*Primary Examiner* — Huan Hoang
(74) *Attorney, Agent, or Firm* — Volentine & Whitt, PLLC

(57) ABSTRACT

A method of programming a resistance variable memory cell to a given logic state includes applying a first programming current to the memory cell, executing a verify read of the memory cell by sensing a logic state of the memory cell, and applying a second programming current to the memory cell when the sensed logic state is different than the given logic state, where the second programming current is greater than the first programming current.

16 Claims, 13 Drawing Sheets

(PRIOR ART)

RESISTANCE VARIABLE MEMORY DEVICE AND METHOD OF WRITING DATA

CROSS-REFERENCE TO RELATED APPLICATIONS

This application is a continuation application of application Ser. No. 12/471,526, filed on May 26, 2009, which claims priority to Korean patent application 10-2008-0041221, filed May 27, 2008, the disclosure of which is incorporated herein in its entirety.

SUMMARY

The present invention generally relates to non-volatile memory devices, and more particularly, the present invention relates to resistance variable memory devices, such as phase-change random access memory (PRAM) devices.

A phase-change random access memory (PRAM), also known as an Ovonic Unified Memory (OUM), is an example of a resistance variable memory device in which characteristics of a variable resistive element are relied on to store data. For example, in the case of a PRAM, each memory cell may include a phase-change material such as a chalcogenide alloy that is responsive to heat so as to be stably transformed between crystalline and amorphous states exhibiting different resistive values.

The phase-change material of the PRAM exhibits a relatively low resistance in its crystalline state, and a relatively high resistance in its amorphous state. In conventional nomenclature, the low-resistance crystalline state is referred to a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time. In each case, the material is allowed to quickly cool to its original temperature after the heat treatment.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIG. 1 is an equivalent circuit diagram of one example of a resistance variable memory cell 10. As shown, the memory cell 10 includes a resistance variable element 11 and a selection element 12 connected in series between a bit line BL and a reference potential (e.g., ground). In this example, the selection element 12 is a transistor NT having a gate terminal connected to a word line WL. Also in this example, the resistance variable element 11 is a phase-change element which includes a GST compound.

FIG. 2 is an equivalent circuit diagram of another example of a resistance variable memory cell 20. As shown, the memory cell 20 includes a resistance variable element 21 and a selection element 22 connected in series between a bit line BL and a word line WL. In this example, the selection element 22 is a diode D. Also in this example, the resistance variable element 21 is a phase-change element which includes a GST compound.

FIG. 3 includes schematic view of the resistance variable element 11 illustrated in FIG. 1. Referring to FIG. 3, the resistance variable element of this example is a phase-change element which includes a top electrode 31, a phase-change material layer 32, a resistive heating element (CP) 33 and a bottom electrode 34. Reference number 35 denotes a programmable volume of the phase-change material layer 32. When selected by the word line WL, current is supplied via the bit line to heat the resistive heating element 33 and thus either set the programmable volume to a crystalline state or reset the programmable volume to an amorphous state. In particular, the set and reset states of the memory cell are established by controlling the magnitude and duration of current flow through the resistive heating element 33.

One drawback associated with resistance variable memory cells, and in particular, phase-change memory cells, relates to a lack of endurance to write cycles. This is illustrated by example in FIG. 4. The curves 41~45 represent a reset resistance relative to applied voltage of phase-change memory cells subjected to increased numbers of write cycles. In other words, the curve 45 represents a phase-change memory cell which has been subjected to the largest number of write cycles. Assuming that the read voltage is V1 in the figure, it is apparent that the possibility of programming error increases as the phase-change memory cell is subjected to increased numbers of write cycles.

According to an aspect of the present invention, a method of programming a resistance variable memory cell to a given logic state is provided. The method of this aspect includes applying a first programming current to the memory cell, executing a verify read of the memory cell by sensing a logic state of the memory cell, and applying a second programming current to the memory cell when the sensed logic state is different than the given logic state, wherein the second programming current is greater than the first programming current.

According to another aspect of the present invention, a method of programming a resistance variable memory cell is provided. The method includes programming to the memory cell to a low resistance logic state by applying a first programming current to the memory cell. The method further includes programming the memory cell to a high resistance state logic state by executing a first verify read of the memory cell to sense a logic state of the memory cell, applying a second programming current to the memory cell when the sensed logic state is different than the high resistance logic state, executing a second verify read of the memory cell to sense a logic state of the memory cell, and applying a third programming current to the memory cell when the sensed logic state is different than the high resistance logic state, wherein the third programming current is greater than the second programming current.

According to still another aspect of the present invention, a resistance variable memory device is provided which includes a resistance variable memory cell which is programmable into a plurality of resistive logic states, a verify read sense amplifier operatively connected to the resistance variable memory cell, and a write drive which selectively applies different high resistive logic state programming pulse currents to the phase-change memory cell according to an output of the verify read sense amplifier.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

The present invention will be described in detail below by way of preferred, but non-limiting, embodiments of the invention. The embodiments presented herein are considered examples of various implementations of the invention, and are not intended to limit or specifically define the overall scope of the invention.

For ease of understanding and to avoid redundancy, like reference numbers refer to the same or similar elements throughout the drawings. Also, while the drawings contain a number of circuit elements, it will be understood from the nature of electrical circuits that when an element is described as being connected to another element, it can be directly connected the other element or one or more intervening elements may be present. In contrast, if an element is referred to as being "directly connected to" another element, then no intervening elements are present. Other words used to describe the relationship between elements should be interpreted in a like fashion (e.g., "between" versus "directly between," "adjacent" versus "directly adjacent," "connected" versus "directly connected," etc.).

As is traditional in the field of the present invention, embodiments of the invention may be described at least partially in terms of functional blocks or units. It will be readily understood that the functional blocks or units denote electronic circuits which are configured (e.g., by dedicated and/or programmable circuitry) to execute the signaling and/or computational operations described herein. Also, it will be readily understood that one or more functional blocks may be physically combined into complex circuitry without departing from the spirit and scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
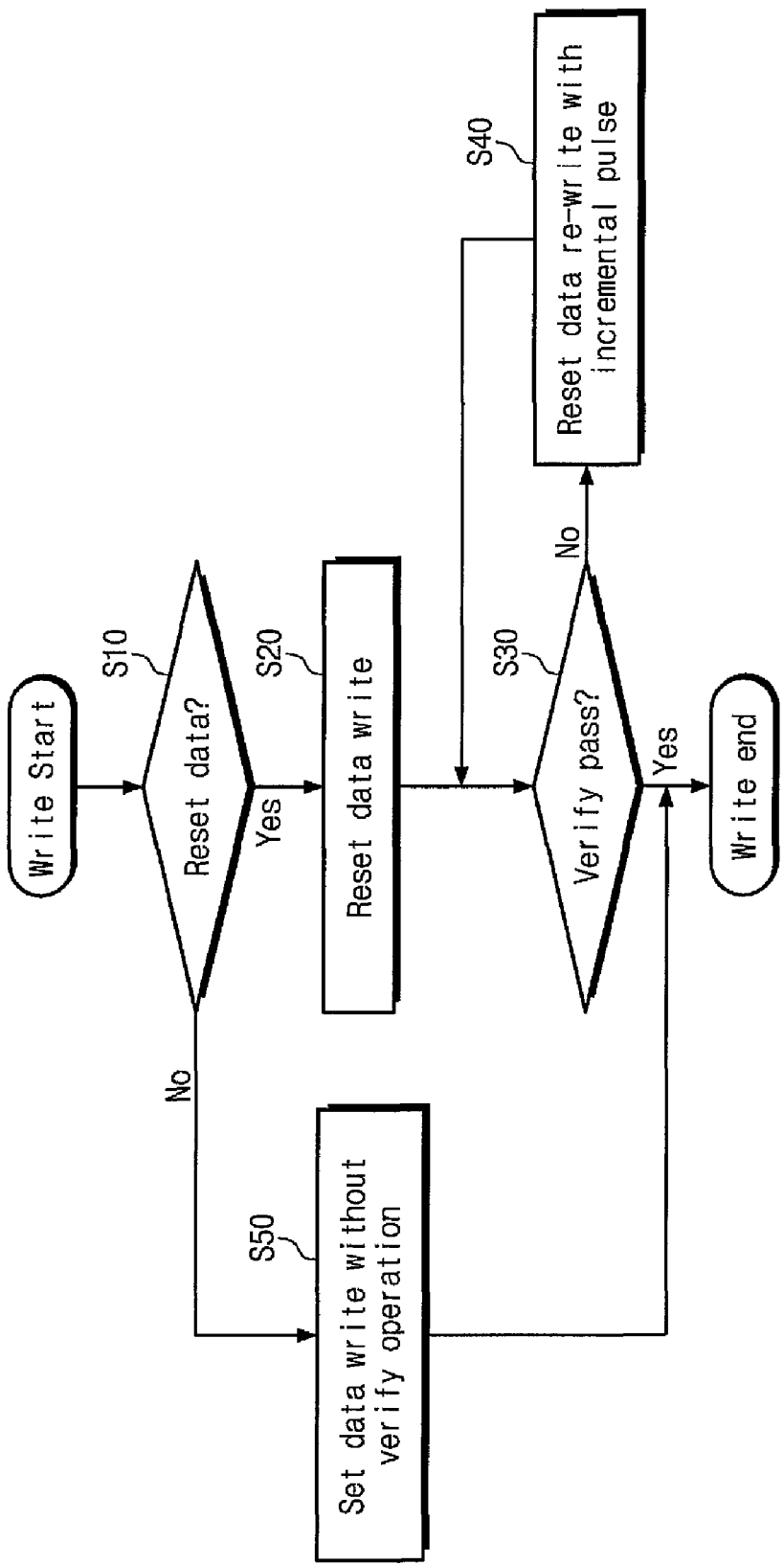
FIG. 5 is a flow chart for use in describing a method of writing data to a resistance variable memory device according to an embodiment of the present invention.

FIG. 5 is a flowchart illustrating a method of programming (writing) a resistance variable memory cell according to an embodiment of the present invention. In this non-limiting example, the resistance variable memory device is a PRAM device including phase-change memory cells.

Referring to FIG. 5, in an initial step S10, a determination is made as to whether a selected phase-change memory cell is to be programmed into a reset state or a set state. As discussed previously, the set state is a low-resistance crystalline state typically designated logic as "0", and the reset state is a high-resistance amorphous state typically designated as logic "1".

In the case where the memory cell is to be programmed to the set state, a set data write process is executed at step S50 by application of a set current to the memory cell. In the example of this embodiment, no subsequent read verification process is executed, and the write routine ends.

In the case where the memory cell is to be programmed to a reset state, an initial reset current pulse is applied to memory cell at step S20 in order to write the reset data into the memory cell. Then, at step S30, a read verify process is executed in order to determine if the memory cell has been sufficiently written to the reset state. If the determination of step S30 is affirmative, then the write process ends. On the other hand, if the memory cell has not been sufficiently written to the reset state, a second reset current pulse is applied to the memory cell at step S40. In a preferred embodiment, a magnitude of the second current pulse is incrementally greater than that applied in step S20.

After step S40, the read verify process is executed again in order to determine if the memory cell has been sufficiently written to the reset state. If the determination of step S30 is affirmative, then the write process ends. On the other hand, if the memory cell has again not been sufficiently written to the reset state, a third reset current pulse is applied to the memory cell at step S40. In a preferred embodiment, a magnitude of the third current pulse incrementally greater than that previously applied in step S20.

The process loop defined by steps S30 and S40 is repeatedly executed with an incrementally increasing magnitude of the reset write current pulse until such time the read verify process indicates that the memory cell has been sufficiently written to the reset state. At that time, the write routine ends.

The embodiment of FIG. 5 is effective in reducing the average magnitude of the current applied to phase-change memory cells as a group. That is, by incrementally increasing the reset write current until a successful write is determined, over-programming of the memory cell is avoided. As will be explained later with reference to FIG. 13, the endurance of the memory cells may be increased.

Figure 6:
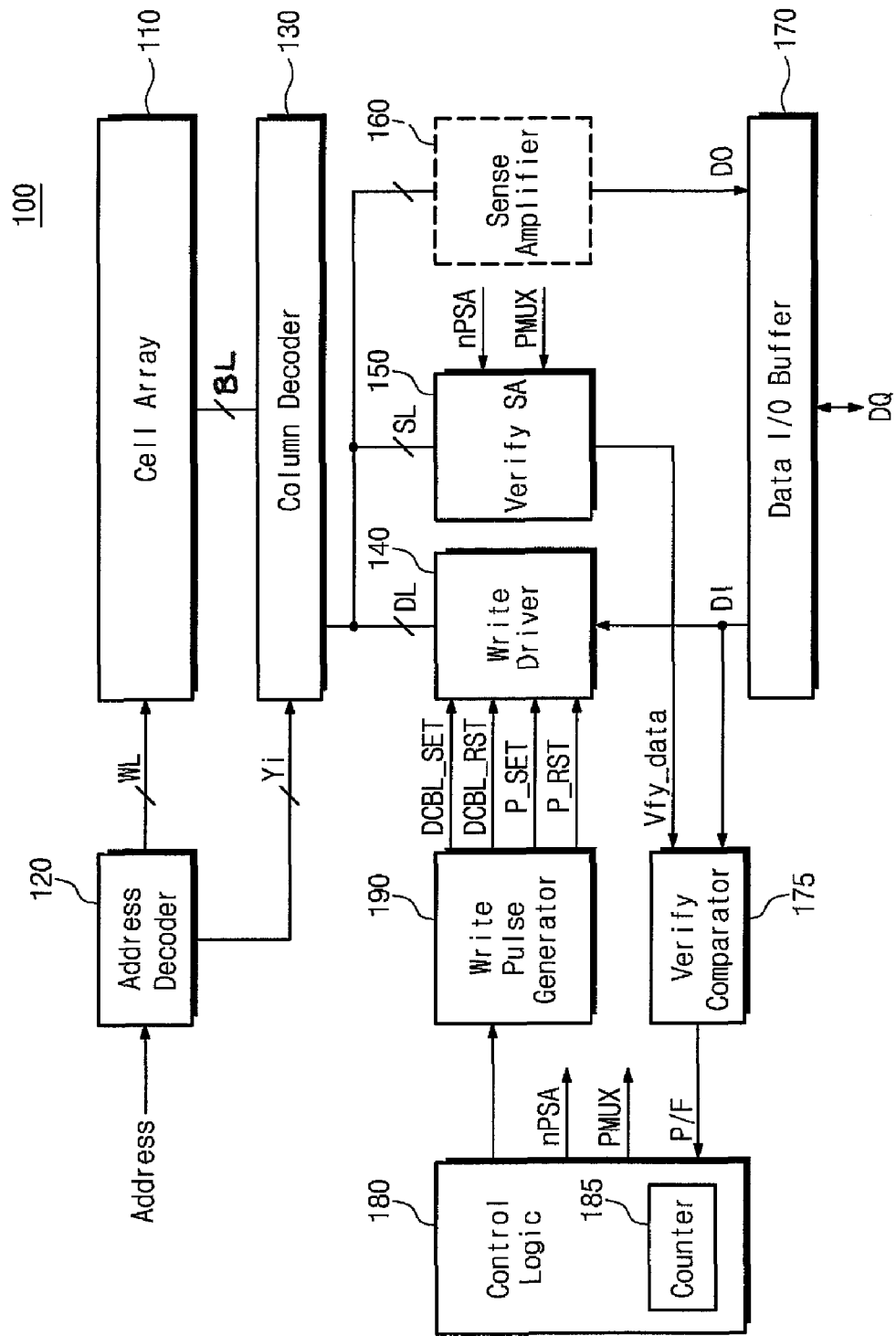
FIG. 6 is a block diagram of a resistance variable memory device according to an embodiment of the present invention.

FIG. 6 illustrates a block diagram of a resistance variable memory device according to an embodiment of the present invention. In the non-limiting example of this embodiment, the resistance variable memory device is a PRAM device 100. The memory device 100 is configured to execute the write routine discussed above in connection with FIG. 5.

Referring to FIG. 6, the PRAM device 100 of this example includes phase-change cell array 100, an address decoder 120, a column decoder 130, a write driver 140, a verify sense amplifier (SA) 150, a read sense amplifier (SA) 160, a data I/O buffer 170, a verify comparator 175, a control logic 180 and a write pulse generator 190.

Figure 1:
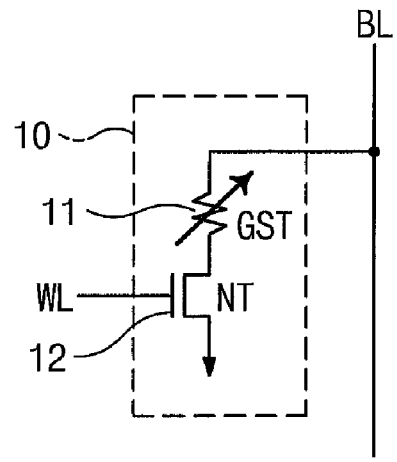
FIG. 1 is an equivalent circuit diagram of a resistance variable memory cell.
Figure 2:
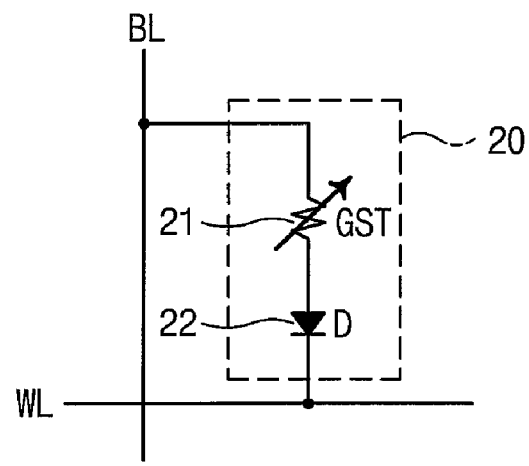
FIG. 2 is an equivalent circuit diagram of another resistance variable memory cell.
Figure 3:
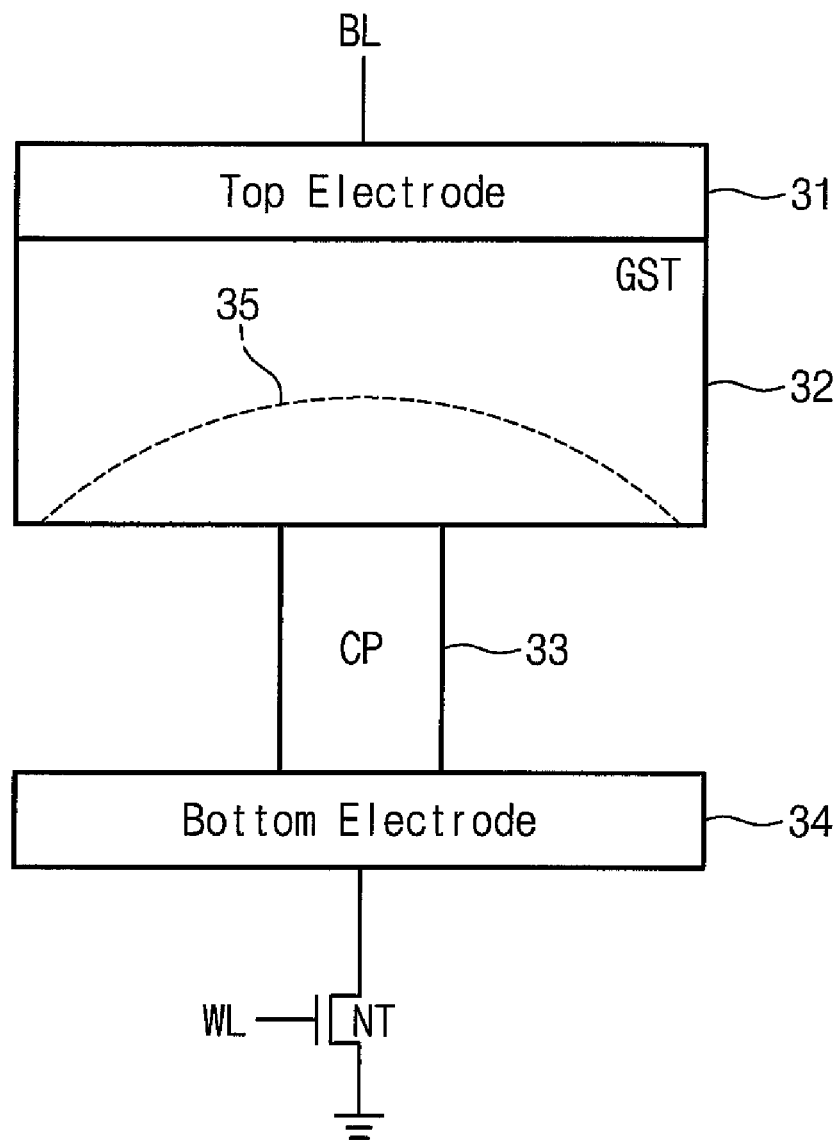
FIG. 3 is a schematic view of the resistance variable memory cell shown FIG. 1.
Figure 4:
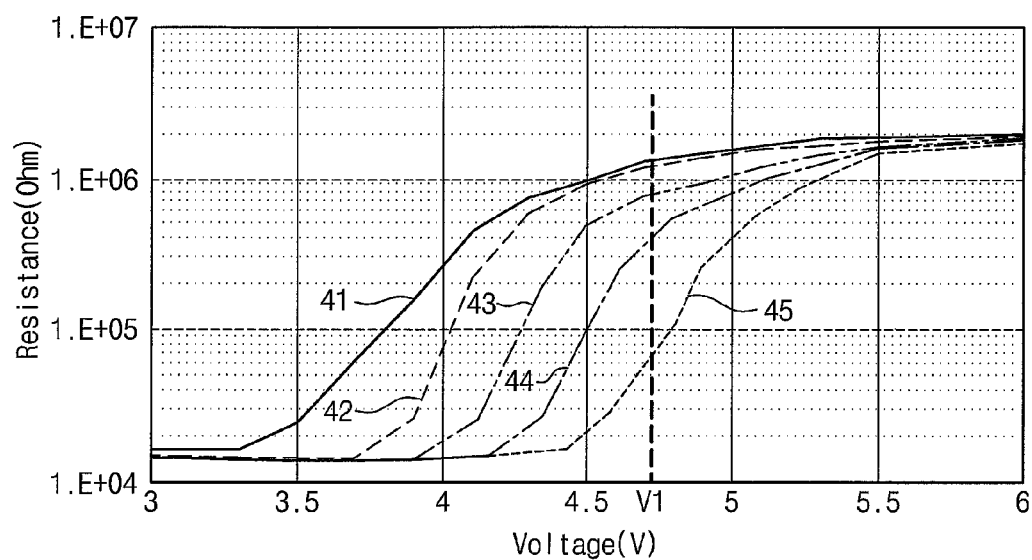
FIG. 4 is a graph illustrating the impact on reset resistance resulting from an increasing number of write operations of a resistance variable memory cell.

Memory cell array 110 includes a plurality of resistance variable memory cells. Each of the memory cells in memory cell array 110 includes a resistance variable memory element and a select element. In the example of this embodiment, each memory element in each memory cell includes a phase change material GST and the select element in each memory cell includes either a transistor (FIG. 1) or a diode (FIG. 2).

The address decoder 120 is connected to memory cell array 110 via word lines WL. Address decoder 120 decodes an address received from an external source, and provides a bias voltage to a selected word line based on the address. In addition, in the example of this embodiment, the address decoder 120 generates a selection signal Yi for selecting a subset of bit lines of the memory cell array 110. The selection signal Yi is provided to bit line selection circuit 130.

The bit line selection circuit 130 is connected to the memory cell array 110 via bit lines BL. The bit line selection circuit 130 selects a subset of bit lines in response to selection signal Yi provided by address decoder 120. Bit line selection circuit 130 may include, for example, a plurality of NMOS transistors (not shown), where each NMOS transistor electrically connects one of the bit lines to a data line DL and sense line SL in response to selection signal Yi. X The data I/O buffer 170, which is connected to an external data bus DQ, supplies input (write) data DI to the verify comparator 175 and to the write driver 140, and receives output (read) data DO from the sense amplifier 160.

The write driver 140 drives the data line DL to write data into selected memory cells of the cell array 110 according to the input data DI. As represented in FIG. 6, the write driver 140 operates according to signals supplied by the write pulse generator 190.

The write pulse generator 190 is responsive to the control logic 180 to generate a set pulse signal P_SET, a reset pulse signal P_RST, a set DC voltage signal DCBL_SET, and a reset DC voltage signal DCBL_RST. The functionality associated with each of these signals will be described later herein.

The control logic 180 controls the overall write and read operations of resistance variable memory device 100. This includes issuing commands to the write pulse generator 190 and generating control signals nPSA and PMUX, each of which is described later herein. In addition, the control logic 180 receives a pass-fall result P/F from the verify comparator 175, and may include a counter 185 associated with a read verify operation. The functionality of the counter 185 will be described later with reference to FIG. 10.

The verify SA 150 is operative to sense read data on the sense line SL, and to supply the result Vfy_data to the verify comparator 175. An example of the verify SA 150 is presented later herein with reference to FIG. 9.

The verify comparator is operative to compare the verification data Vfy_data and the input data DI. When the compared data are the same, then a PASS signal is supplied to the control logic 180. When the compared data are difference, a FAIL signal is supplied to the control logic 180.

The sense amplifier 160 of FIG. 6 is function to sense data on the data line DL, and to supply the sense data as output data DO to the data I/O buffer 170. However, as suggested by the dashed line in the figure, the sense amplifier 160 can be omitted and the functionality thereof combined with the verify SA 150.

Figure 7:
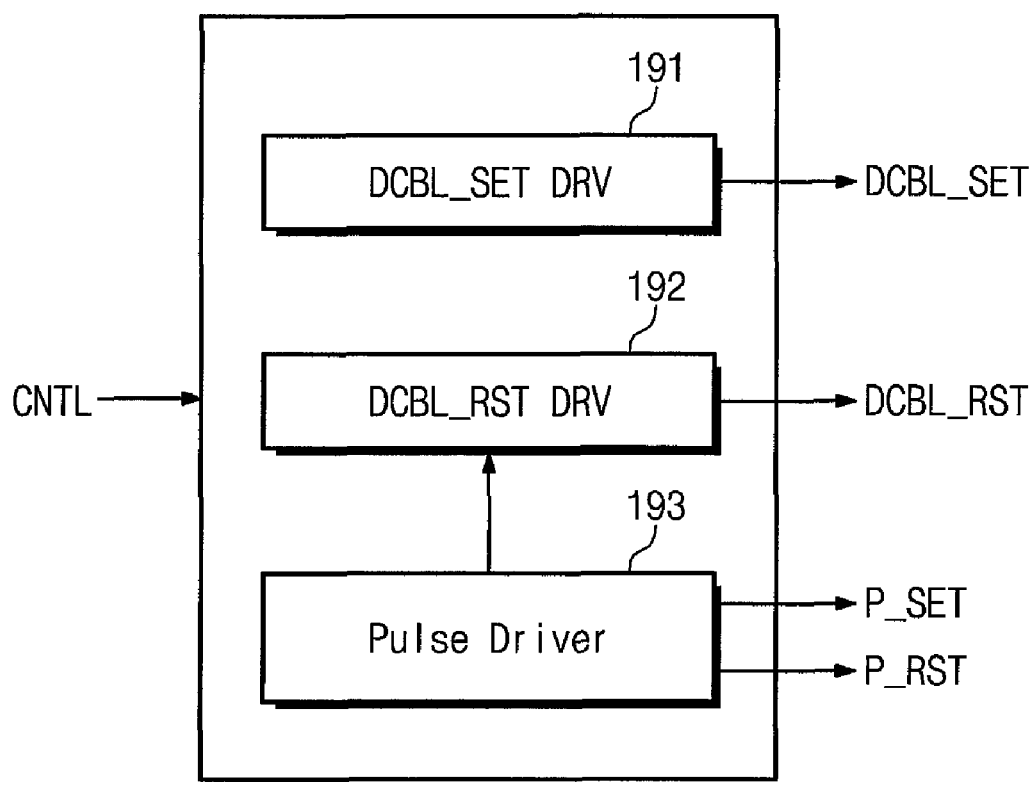
FIG. 7 is a block diagram of a write pulse generator shown in FIG. 6 according to an embodiment of the present invention.

An embodiment of the write pulse generator 190 of FIG. 6 is illustrated by the block diagram of FIG. 7.

Referring to FIG. 7, the write pulse generator 190 of this example includes a set DC voltage DCBL_SET driver 191, a reset DC voltage DCBL_RST drive 192, and a pulse driver 193, all operating under command of control signals CNTL generated by the control logic 180 (FIG. 6). As will be explained in greater detail later with reference to FIG. 11, the set DC voltage DCBL_SET driver 191 and the reset DC voltage DCBL_RST drive 192 are operative in a write mode to selectively generate a set DC voltage DCBL_SET and a reset DC voltage DCBL_RST, respectively. Also in the write mode, the pulse driver 193 is operative to generate a set pulse signal P_SET and a reset pulse signal P_RST. The set pulse signal P_SET and reset pulse signal P_RST will also be explained later with reference to FIG. 11.

Figure 8:
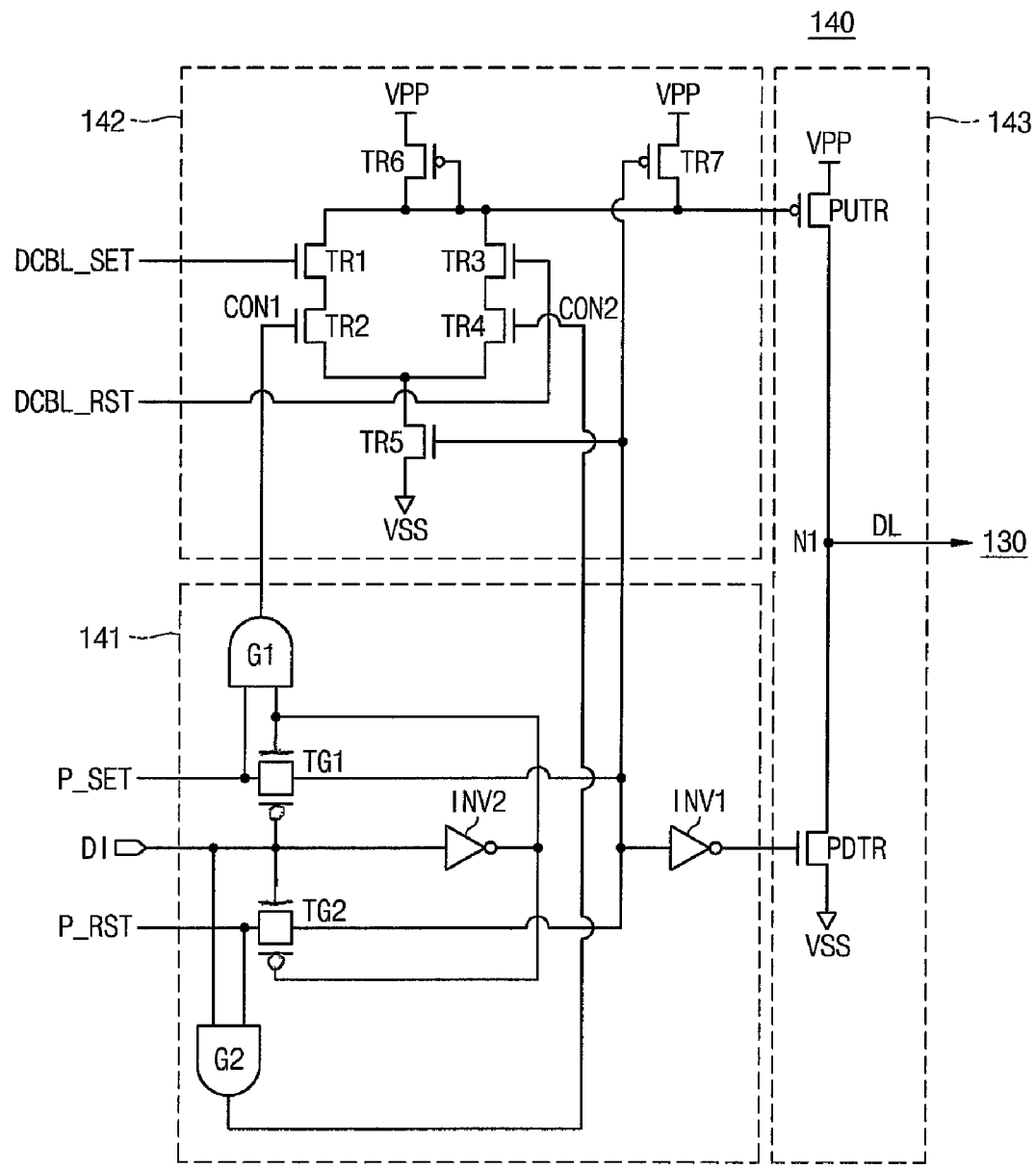
FIG. 8 is a circuit diagram of a write driver shown in FIG. 6 according to an embodiment of the present invention.

An embodiment of the write driver 140 of FIG. 6 is illustrated by the circuit diagram of FIG. 8.

Referring to FIG. 8, the write driver 140 of this example includes a pulse control circuit 141, a current control circuit 142, and a current drive circuit 143. The pulse control circuit 141 of this example includes transmission gates TG1 and TG2, logic AND gates G1 and G2, and inverters INV1 and INV2. The current control circuit 142 of this example includes first through seventh transistors TR1~TR7. The current drive circuit 143 includes pull-up and pull-down transistors PUTR and PDTR, respectively.

An operation of the write driver 140 illustrated in FIG. 8 will be explained next with reference to the timing diagram of FIG. 11.

Figure 11:
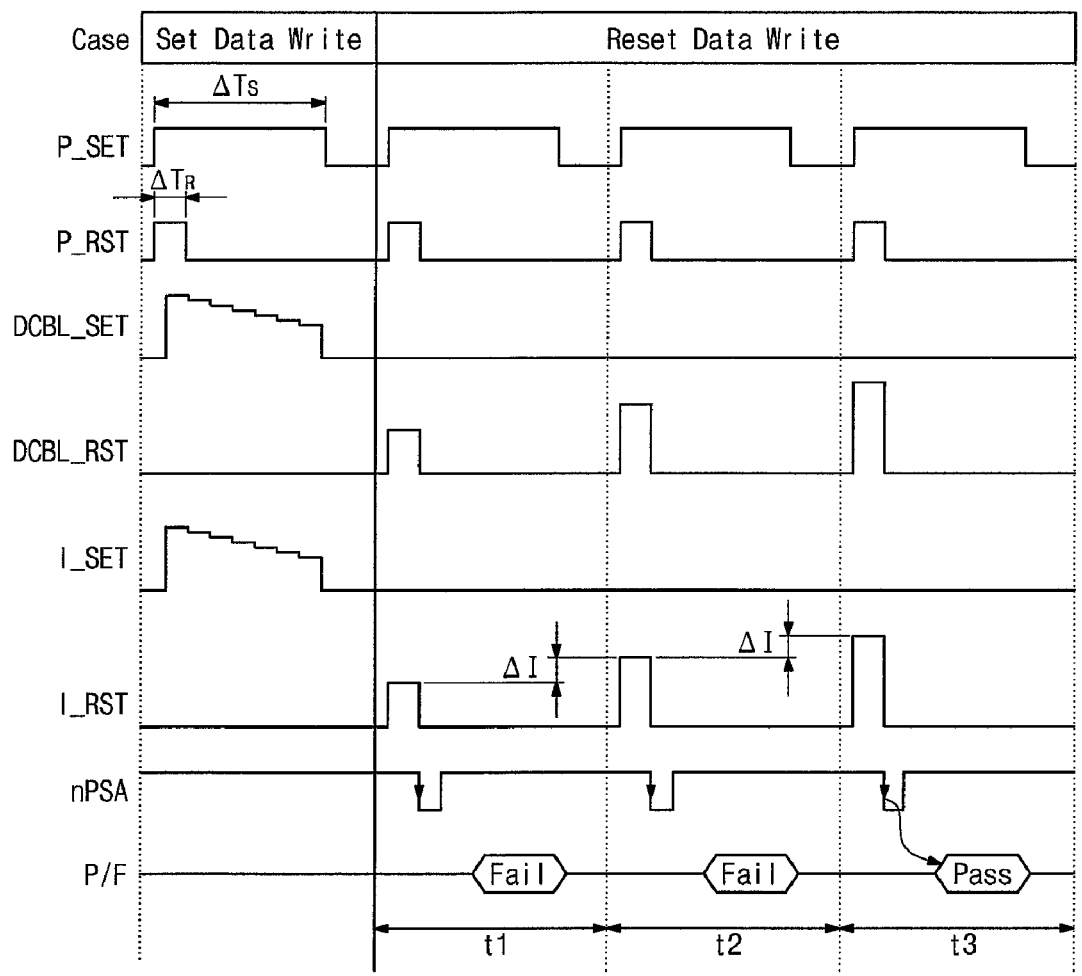
FIG. 11 is a timing diagram for use in describing a write operation of the resistance variable memory device of FIG. 6 according to an embodiment of the present invention.

In this example, the set pulse signal P_SET and reset pulse P_RST (generated by the write pulse generator of FIG. 7) are synchronized, with each set pulse having a pulse width $\Delta T_S$ and each reset pulse having a pulse width $\Delta T_R$, where $\Delta T_S$ is greater than $\Delta T_R$ as shown in FIG. 11. The set pulse signal P_SET is applied to the transmission gate TG1 and to one input of the AND gate G1 of the pulse control circuit 141, while the reset pulse P_RST is applied to the transmission gate TG2 and one input of the AND gate G1 of the pulse control circuit 141.

In a set data write operation, input data DI is logic LOW (set), the output of the inverter INV2 is HIGH, and thus the transmission gate TG1 is ON and the transmission gate TG2 is OFF. Further, the output of the AND gate G2 is held LOW, while the output of the AND gate G1 corresponds to the set pulse signal P_SET. In this manner, a signal corresponding to the set pulse signal P_SET is applied to the control terminal CON1 of the current control circuit 142, while a LOW signal is maintained at the control terminal CON2 of the current control circuit 142. Transistor TR4 is therefore held in an OFF state. In the meantime, the set DC voltage DCBL_SET is applied to the gate of the transistor TR1 of the current control circuit 142. In addition, the set pulse signal P_SET is applied to the gates of the transistors TR5 and TR7, and an inverse of the set pulse signal P_SET is applied to the gate of the pull-down transistor PDTR. Accordingly, the transistors TR7 and PDTR are turned OFF in synchronization with the set pulse signal P_SET, and the transistors TR5 and TR6 are turned ON in synchronization with the set pulse signal P_SET. Thus, when the set pulse signal P_SET is HIGH, a current flows through the transistors TR1 and TR2 corresponding to the magnitude of the set DC voltage DCBL_SET.

In the example of FIG. 11, the set DC voltage DCBL_SET is a stepped-down voltage, and accordingly, the current flowing through the transistors TR1 and TR2 is stepped-down as well. Due to a current mirror effect, a current of substantially the same stepped-down magnitude flows through the pull-up transistor PUTR and is output as an output current I_SET on a data line DL.

In a reset data write operation, input data DI is logic HIGH (reset), the output of the inverter INV2 is LOW, and thus the transmission gate TG1 is OFF and the transmission gate TG2 is ON. Further, the output of the AND gate G1 is held LOW, while the output of the AND gate G2 corresponds to the reset pulse signal P_RST. In this manner, a signal corresponding to the reset pulse signal P_RST is applied to the control terminal CON2 of the current control circuit 142, while a LOW signal is maintained at the control terminal CON1 of the current control circuit 142. Transistor TR2 is therefore held in an OFF state. In the meantime, the reset DC voltage DCBL_RST is applied to the gate of the transistor TR4 of the current control circuit 142. In addition, the reset pulse signal P_RST is applied to the gates of the transistors TR5 and TR7, and an inverse of the reset pulse signal P_RST is applied to the gate of the pull-down transistor PDTR. Accordingly, the transistors TR7 and PDTR are turned OFF in synchronization with the reset pulse signal P_RST, and the transistors TR5 and TR6 are turned ON in synchronization with the reset pulse signal P_RST. Thus, when the set pulse signal P_RST is HIGH, a current flows through the transistors TR3 and TR4 corresponding to the magnitude of the reset DC voltage DCBL_RST.

In the example of FIG. 11, the reset DC voltage DCBL_RST is periodically generated in each of time periods t1~t3 as a voltage pulse of incrementally increasing magnitude, and accordingly, the current flowing through the transistors TR3 and TR4 is defined by current pulses of incrementally increasing (ΔI) magnitude. Due to a current mirror effect, a pulsed current of substantially the same magnitude flows through the pull-up transistor PUTR and is output as an output current I_RST on the data line DL.

As explained previously in connection with FIG. 6, the write current I_SET or I_RST is applied to selected bit lines of the cell array 100 in order to program selected memory cells of the selected bit lines. In the case of a reset write, a read verify operation is executed after each I_RST pulse (FIG. 11), and if the read verify results in a PASS, the reset write operation is terminated. On the other hand, if the read verify results in a FAIL, a next I_RST pulse (which is incrementally increased by ΔI) is applied to the selected bit line, and another read verify operation is executed. This process is continued until a PASS condition is achieved, or until a maximum number of write attempts has been executed.

Figure 9:
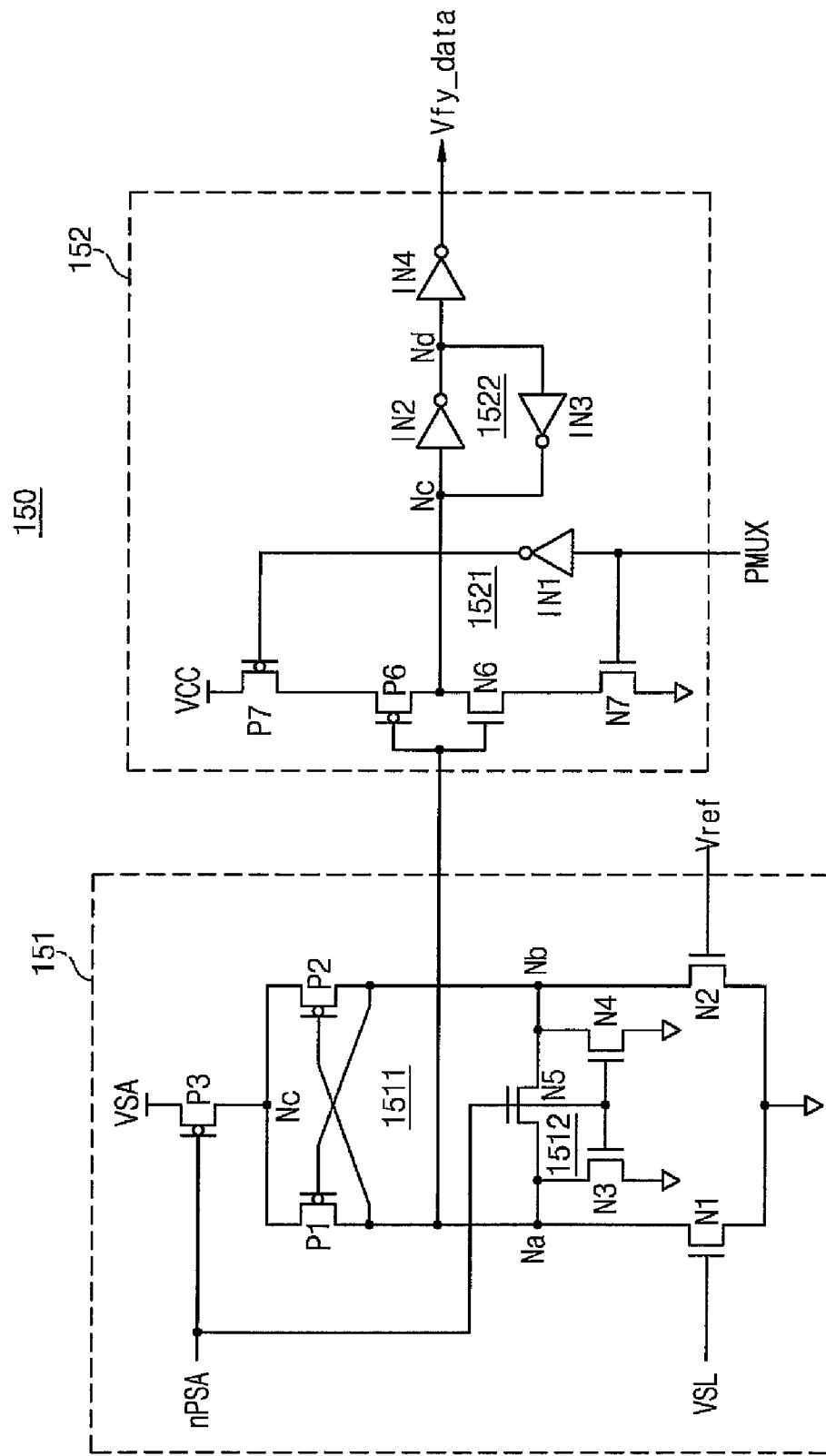
FIG. 9 is a circuit diagram of a verify sense amplifier shown in FIG. 6 according to an embodiment of the present invention.

FIG. 9 illustrates an example of a verify sense amplifier (SA) circuit 150 illustrated in FIG. 6. The verify SA circuit 150 outputs a sensing result Vfy_data based on a comparison of a voltage of the sensing node VSL and the reference voltage Vref. The sensing node VSL is electrically connected to the programmed memory cell via the column decoder 130 and sense line SL shown in FIG. 6. The verify SA circuit 150, which receives a high voltage VSA, is operative to execute a sensing operation in response to the control signals nPSA and PMUX generated by the control logic 180 (FIG. 6).

As shown in FIG. 9, the verify SA circuit 150 of this example includes a sensing circuit 151 and a latch circuit 152.

The sensing circuit 151 of this example includes a plurality of PMOS transistors P1~P3 and a plurality of NMOS transistors N1~N5 which make up a differential amplifier 1511 and an equalizer 1512. In operation, the differential amplifier 1511 senses and amplifies the difference between the reference voltage Vref and a voltage of the sensing node VSL, while the equalizer 1512 equalizes the voltage levels at output nodes Na and Nb. In particular, the differential amplifier 1511 is composed of the first and second NMOS transistors N1 and N2, and the first, second and third PMOS transistor P1, P2, and P3. The first NMOS transistor N1 forms a current path between the first node Na and ground in response to a voltage of the sensing node VSL. The second NMOS transistor N2 forms a current path between the second node Nb and ground in response to the reference voltage Vref. The first PMOS transistor P1 forms a current path between a third node Nc and the first node Na in response to a voltage of the second node Nb. The second PMOS transistor P2 forms a current path between the third node Nc and the second node Nb in response to a voltage of the first node Na. The third PMOS transistor P3 forms a current path between the power terminal voltage VSA and the third node Nc in response to a LOW state of the control signal nPSA. The third PMOS transistor P3 accepts the high voltage VSA through the power terminal. The equalizer 1512 is composed of the third, fourth and fifth NMOS transistors N3, N4, and N5. The third NMOS transistor N3 is connected between the first node Na and ground. The fourth NMOS transistor N4 is connected between the second node Nb and ground. The fifth NMOS transistor N5 is connected between the first node Na and the second node Nb. The third through fifth NMOS transistors N3~N5 are simultaneously turned ON or OFF in response to the control signal nPSA.

The latch circuit 152, which is connected to the first node Na of the sensing circuit 151, outputs the sensing result Vfy_data in response to the control signal PMUX. The latch circuit 152 of this example includes an inversion circuit 1521 and a latch 1522. The inversion circuit 1521 is connected between the first Na and a fourth nodes Nd, and operates in response to the control signal PMUX. In this example, the inversion circuit 1521 is composed of sixth and seventh PMOS transistors P6 and P7, a sixth and seventh NMOS transistor N6 and N7, and a first inverter IN1. When the control signal PMUX is logic HIGH, the inversion circuit 1521 outputs an inverse signal from a voltage level of the first node Na.

The latch 1522, which in this example includes third through fourth inverters IN2~IN4, latches the output of the inversion circuit 1521 and outputs the same as Vfy_data.

Referring again to FIGS. 6 and 11, in the reset data write operation, the verify SA 150 is enabled (by a LOW pulse of nPSA) after each pulse of the reset write current I_RST. The resultant Vfy_data is supplied to the Verify Comparator 175, which compares the same with the original write data DI (reset "1"). The pass/fail result P/F is supplied to the control logic 180. In the case of a PASS condition, the control logic 180 terminates the write process. In the case of a FAIL condition, the control logic 180 commands the write pulse generator 190 to generate a next reset pulse P_RST and an incrementally increased reset DC voltage DCBL_RST. In this manner, as described previously in connection with FIG. 5, a reset write of the memory cell is again attempted using a reset write current pulse of higher magnitude.

Figure 12:
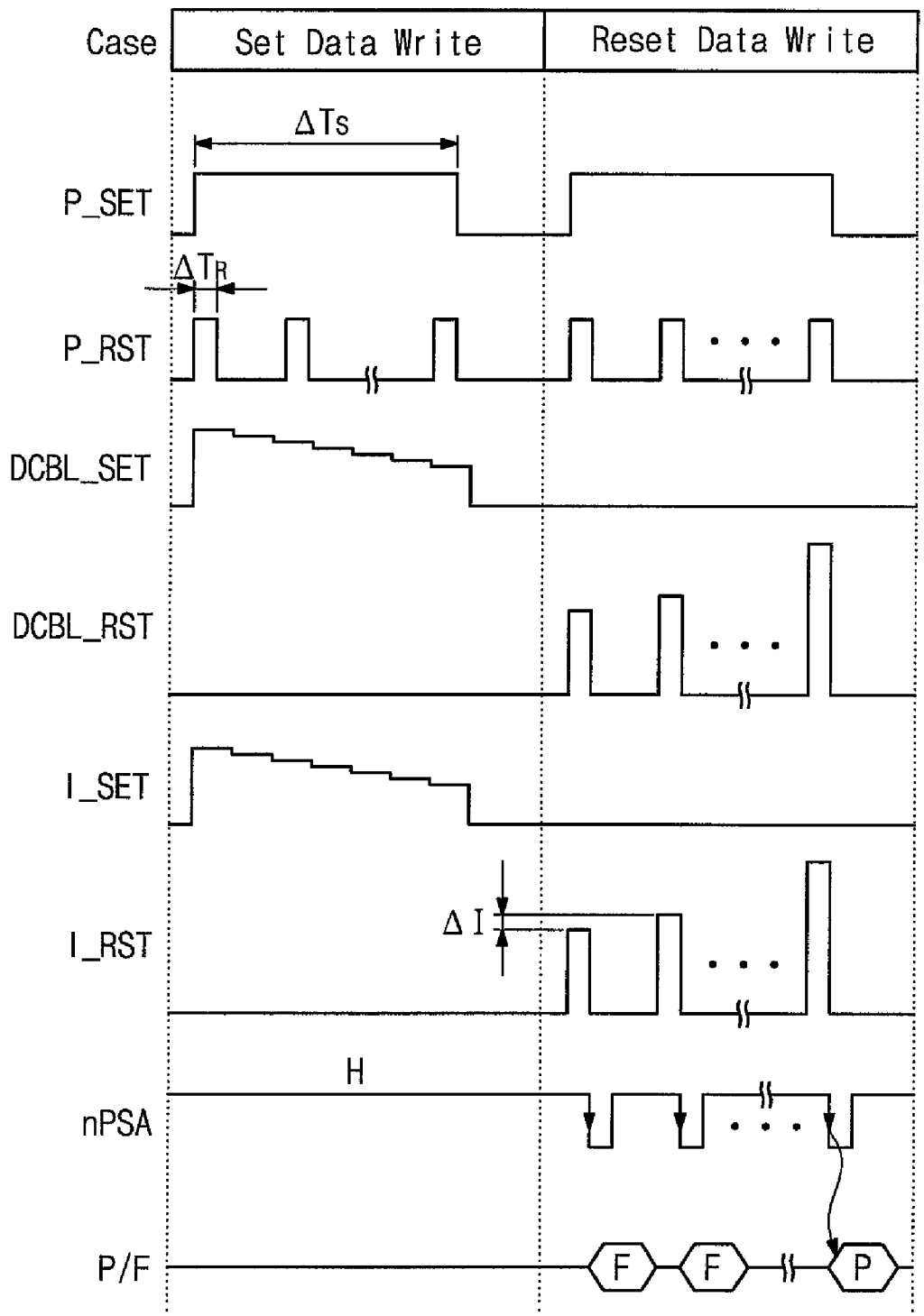
FIG. 12 is a timing diagram for use in describing a write operation of the resistance variable memory device of FIG. 6 according to another embodiment of the present invention.

FIG. 12 is a timing diagram illustrating one non-limiting alternative to the operation described above in connection with FIG. 11. In FIG. 12, multiple pulses of the reset pulse signal P_SET and the reset DC voltage DCBL_RST are generated during the time period of one set write operation ($\Delta T_S$). In this manner, the time period required for the reset write operation can be reduced. Also, as shown in FIG. 12, a programming time interval for programming the phase-change memory cell to the set state and the programming time interval for programming the phase-change memory cell to the reset state can be made equal. This can be done, for example, by establishing a maximum number of reset write pulses that can be applied during the reset write operation.

Figure 10:
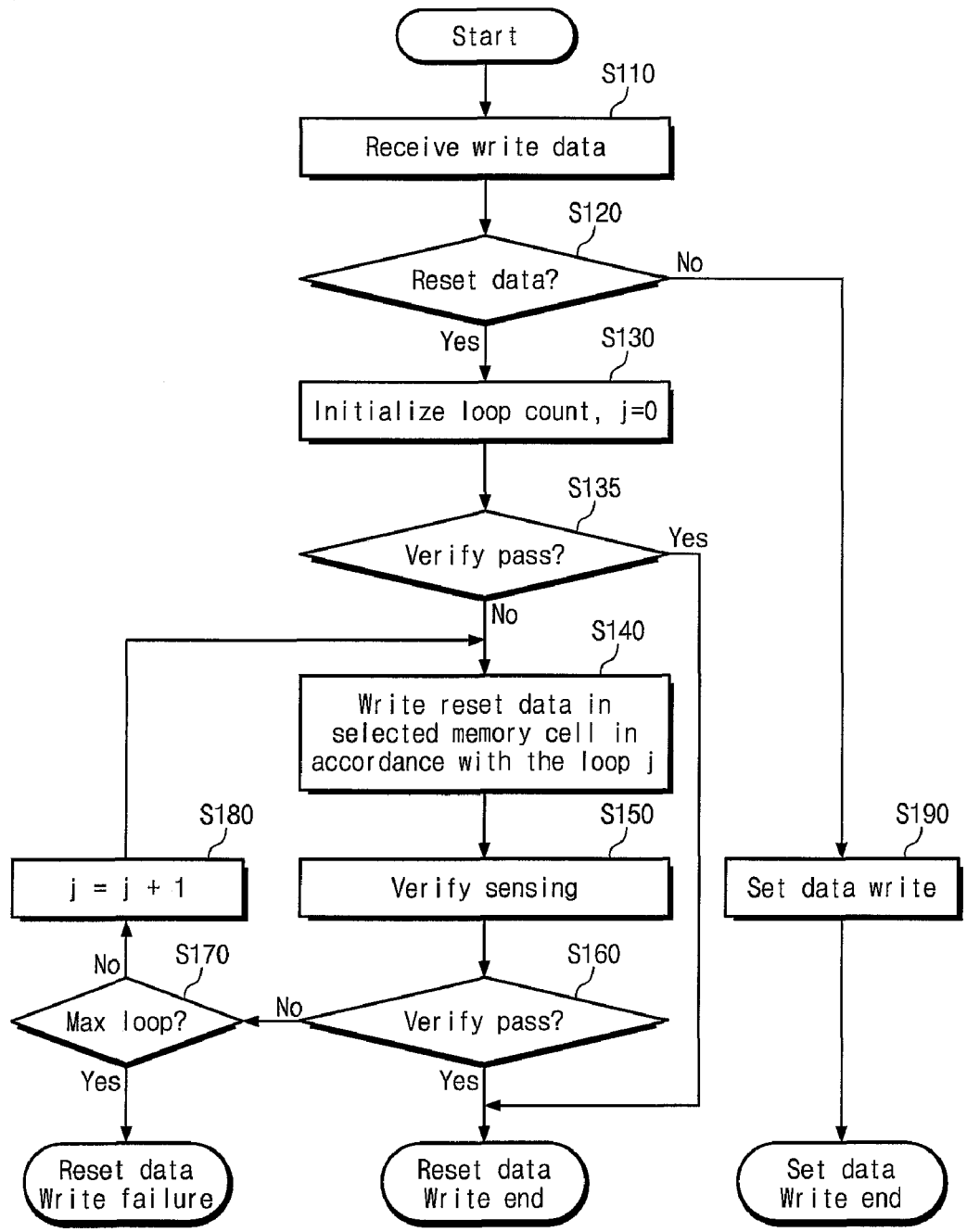
FIG. 10 is a flow chart for use in describing a method of writing data to a resistance variable memory device according to another embodiment of the present invention.

FIG. 10 is a flowchart illustrating another embodiment of the invention in which a maximum number of reset write attempts is set in advance.

Referring to FIG. 10, write data is received at step S110, and if the write data is set data ("0") at step S120, then a set data write operation is executed at step S190 and the write process is terminated. If the write data is reset data ("1") at step S120, then a loop count "j" is initialized to 0 at step S130. For example, the counter 185 (FIG. 6) may be utilized for this purpose. Next, a read verify of the memory cell is executed at step S135 (prior to the first reset write attempt). If the verify read result is a PASS (i.e., data "1" is already written), then the write process is terminated. If the verify read result is FAIL, then the process proceeds to step S140 in which a first attempt is made to write the reset data into the selected memory cell. A verify sense operation is then executed at step S150, and if the result is a PASS at step S160, then the write process is termination. If the read verify result is a FAIL at step S160, then a determination is made at step S170 to determine if the count "j" is at a maximum. If the count "j" is not at a maximum, then "j" is incremented by 1 at step S180, and the process returns to step S140. At step S140, another attempt is made to write the reset data into the memory cell, but with a write current pulse of a greater magnitude. The process loop illustrated in FIG. 10 is continued until either the read verify result is PASS or the count "j" reaches the maximum. In the later case, a write failure results.

Figure 13:
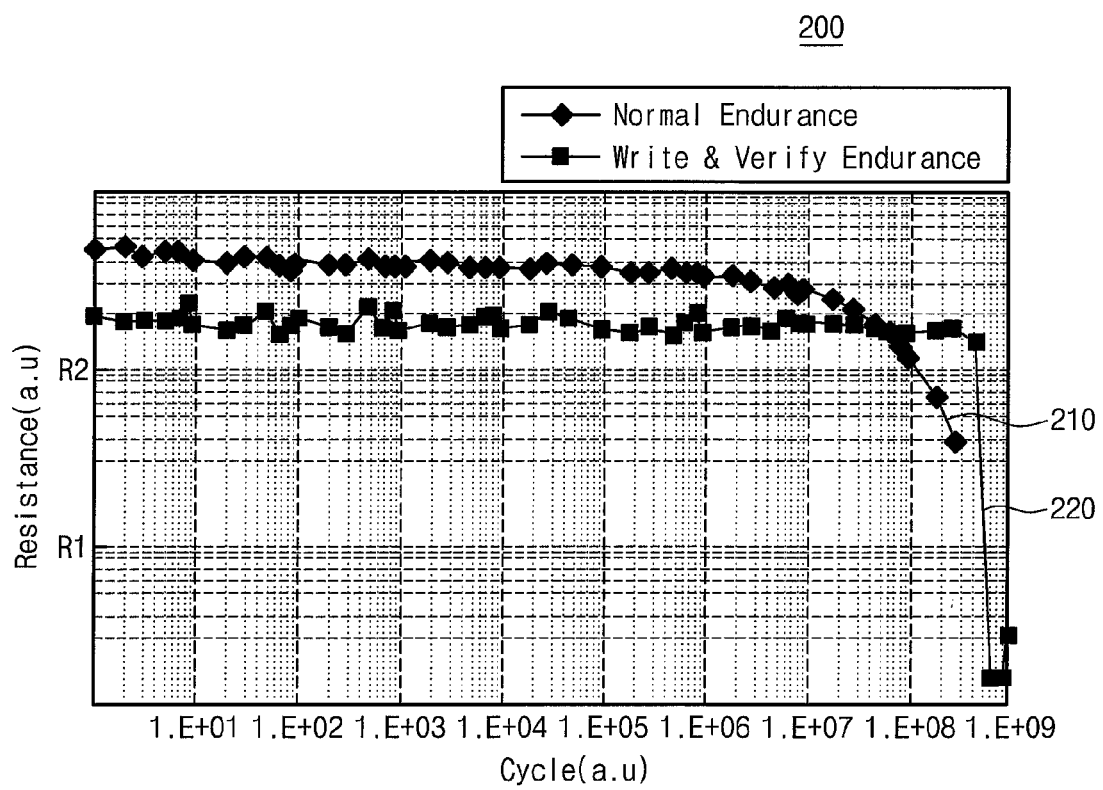
FIG. 13 is a graph for use in comparing the endurance of a resistance variable memory device in accordance with embodiments of the present invention.

FIG. 13 is a graph containing data which demonstrates in the enhanced endurance achieved by embodiments of the present invention. In particular, the graph illustrates a normalized reset resistance relative to a number of write cycles subjected to a phase-change memory cell. The curve 210 of the figure represents reset resistances of a normal write operation, and the curve 220 represents reset resistances resulting from write operation according to embodiments of the present invention. It can be seen that a marked improvement in device endurance can be r achieved by embodiments of the present invention.

Figure 14:
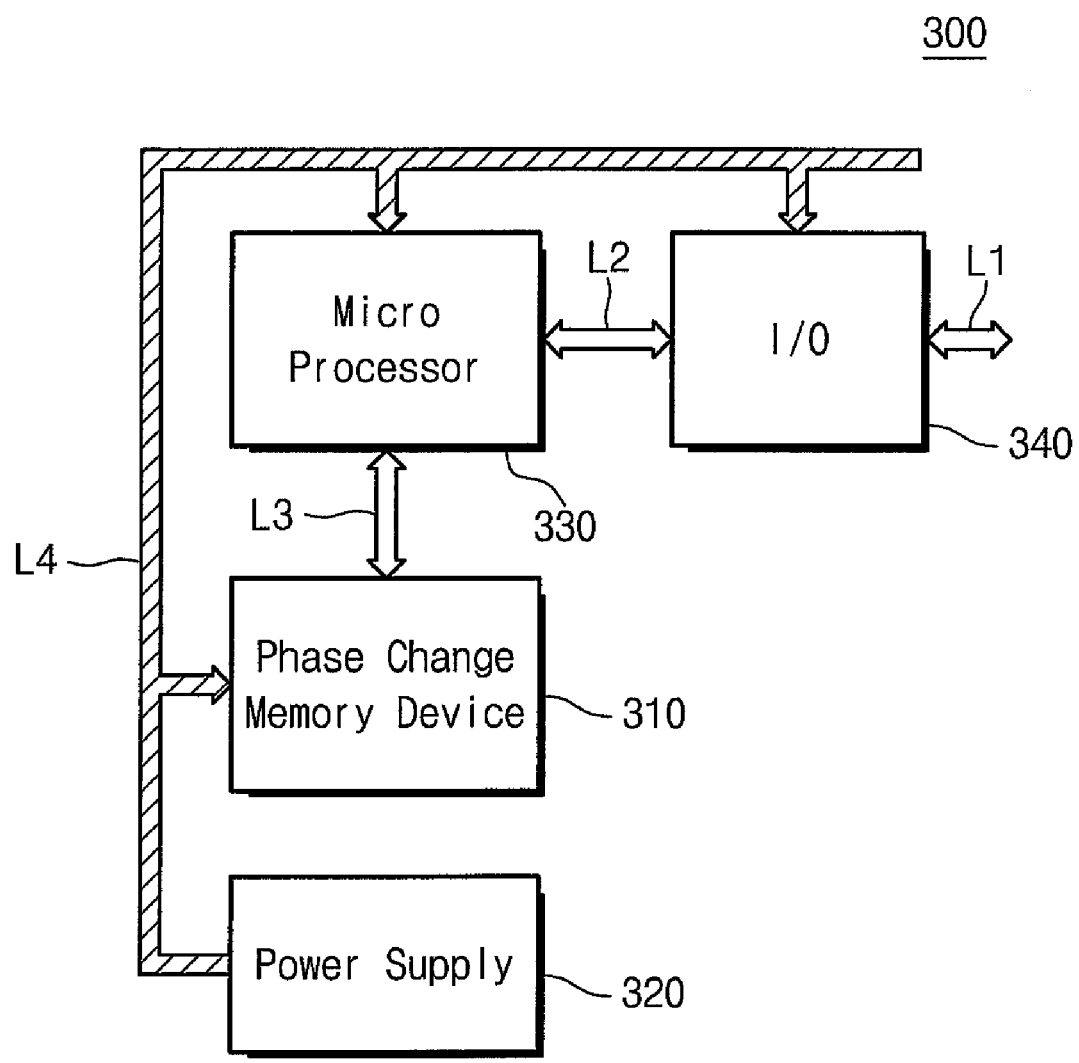
FIG. 14 is a block diagram of a system which includes a resistance variable memory device according to one or more embodiments of the present invention.

FIG. 14 is a block diagram of an information processing system 300 including an example embodiment of a resistance variable memory device. In this example, the resistance variable memory device is a phase-change memory device capable of retaining its stored data in the absence of supplied power supply. The information processing system 300 may, for example, be a mobile device such as a mobile phone, PDA, digital camera, portable game console, and MP3 player. Alternately, information processing system 300 can be a non-portable device such as a desk top computer.

As shown in FIG. 14, the information processing system 400 of this example includes a PRAM 310, an input/output device (shown as I/O) 340, a microprocessor 330, and a power supply 320, all of which are electrically connected through a system bus L4. The PRAM 310 corresponds to one or more embodiments of the present invention as described herein. For example, the PRAM 310 may be realized according to the embodiment of FIG. 5. The information processing system 300 further includes a sub-system buss L1 for transmitting data/commands to and from the I/O 340, a sub-system bus L2 for transmitting data/commands between the microprocessor 330 and the I/O 340, and a sub-system bus for transmitting data/commands between the microprocessor 330 and the PRAM 310. Although not illustrated in the drawings, it is apparent to those skilled in the art that the example embodiment of the information processing system 400 may further include an application chipset, a camera image processor (CIS), a mobile DRAM, a NAND flash memory device, and so on.

The embodiments herein are not limited to PRAM memory cells, and may be applied to other types of memory cells which utilized a material which varies in resistance in order to store data. Such memory cells are referred to herein as resistance variable memory cells. Examples include CBRAM (Conductive Bridging RAM) and ReRAM (Resistive RAM) devices.

Further, the embodiments herein are not limited to single-bit memory cells for storing single bits of data. Instead, the embodiment may also be applied to multi-bit memory cells in which each cell is programmable into three or more resistive states. For example, in the case of a multi-bit PRAM cell, the incremental increase in write current pulses may be applied to the highest resistive state among the three or more resistive states of the multi-bit memory cell.

In other words, the foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method, comprising:
   applying a programming current to a resistance variable memory cell to program the resistance variable memory cell to a given logic state; and
   selectively executing a verify read operation of the resistance variable memory cell in accordance with the given logic state,
   wherein the verify read operation is skipped when the given logic state is a SET state.

2. The method of claim 1, wherein the verify read operation is executed when the given logic state is a RESET state.

3. The method of claim 1, wherein the verify read operation is executed when the resistance variable memory cell is programmed to an amorphous state.

4. The method of claim 1, wherein the memory cell is a phase-change memory cell.

5. A method, comprising:
   applying a programming current to a resistance variable memory cell to program the resistance variable memory cell to a given logic state; and selectively executing a verify read operation of the resistance variable memory cell in accordance with the given logic state, wherein the verify read operation is skipped when the resistance variable memory cell is programmed to a crystalline state.

6. The method of claim 5, wherein the verify read operation is executed when the given logic state is a RESET state.

7. The method of claim 5, wherein the verify read operation is executed when the resistance variable memory cell is programmed to an amorphous state.

8. The method of claim 5, wherein the memory cell is a phase-change memory cell.

9. A device, comprising:
a resistance variable memory cell;
a write driver configured to apply a programming current to the resistance variable memory cell to program the resistance variable memory cell to a given logic state;
a sense amplifier operatively connected to the resistance variable memory cell; and
control logic configured to control the write driver and the sense amplifier,
wherein the control logic is configured to selectively execute a verify read operation of the resistance variable memory cell in accordance with the given logic state, and
wherein the control logic is configured to skip the verify read operation when the given logic state is a SET state.

10. The device of claim 9, wherein the control logic is configured to execute the verify read operation when the given logic state is a RESET state.

11. The device of claim 9, wherein the control logic is configured to execute the verify read operation when the resistance variable memory cell is programmed to an amorphous state.

12. The device of claim 9, wherein the memory cell is a phase-change memory cell.

13. A device, comprising:
a resistance variable memory cell;
a write driver configured to apply a programming current to the resistance variable memory cell to program the resistance variable memory cell to a given logic state;
a sense amplifier operatively connected to the resistance variable memory cell; and
control logic configured to control the write driver and the sense amplifier,
wherein the control logic is configured to selectively execute a verify read operation of the resistance variable memory cell in accordance with the given logic state, and
wherein the control logic is configured to skip the verify read operation when the resistance variable memory cell is programmed to a crystalline state.

14. The device of claim 13, wherein the control logic is configured to execute the verify read operation when the given logic state is a RESET state.

15. The device of claim 13, wherein the control logic is configured to execute the verify read operation when the resistance variable memory cell is programmed to an amorphous state.

16. The device of claim 13, wherein the memory cell is a phase-change memory cell.

\* \* \* \* \*